(12) United States Patent
Lee et al.

(10) Patent No.: US 10,269,875 B2
(45) Date of Patent: Apr. 23, 2019

(54) ORGANIC LIGHT-EMITTING DISPLAY DEVICE

(71) Applicant: LG DISPLAY CO., LTD., Seoul (KR)

(72) Inventors: So-Hee Lee, Suwon-si (KR); Jin-Ho Park, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/858,942

(22) Filed: Dec. 29, 2017

(65) Prior Publication Data

US 2018/0190732 A1 Jul. 5, 2018

(30) Foreign Application Priority Data

Dec. 30, 2016 (KR) .................. 10-2016-0184421

(51) Int. Cl.
| | | |
|---|---|---|
| H01L 27/32 | (2006.01) | |
| H01L 51/50 | (2006.01) | |
| H01L 51/00 | (2006.01) | |
| H01L 51/52 | (2006.01) | |
| H01L 51/56 | (2006.01) | |

(52) U.S. Cl.
CPC ...... *H01L 27/3218* (2013.01); *H01L 27/3211* (2013.01); *H01L 27/3246* (2013.01); *H01L 51/5004* (2013.01); *H01L 51/5064* (2013.01); *H01L 51/001* (2013.01); *H01L 51/0011* (2013.01); *H01L 51/5209* (2013.01); *H01L 51/56* (2013.01); *H01L 2227/323* (2013.01); *H01L 2251/552* (2013.01); *H01L 2251/558* (2013.01)

(58) Field of Classification Search
CPC ............ H01L 27/3218; H01L 27/3246; H01L 51/5004; H01L 51/5064; H01L 51/001; H01L 51/0011; H01L 51/5209; H01L 51/56

See application file for complete search history.

(56) References Cited

U.S. PATENT DOCUMENTS

| | | | | |
|---|---|---|---|---|
| 9,515,127 B2 * | 12/2016 | Pyo | ...... | H01L 27/3211 |
| 9,570,519 B2 * | 2/2017 | Lee | ...... | H01L 51/5278 |
| 2015/0194623 A1 * | 7/2015 | Pyo | ...... | H01L 51/5036 257/40 |
| 2016/0218154 A1 * | 7/2016 | Pyo | ...... | H01L 27/3211 |

\* cited by examiner

*Primary Examiner* — Christine A Enad
(74) *Attorney, Agent, or Firm* — Birch, Stewart, Kolasch & Birch, LLP

(57) ABSTRACT

An organic light-emitting display device is discussed in which an auxiliary hole transport layer is provided in contact with a hole injection layer in at least one sub-pixel, thereby preventing current leakage to an adjacent sub-pixel due to a common layer having high hole mobility and consequently preventing the adjacent sub-pixel from being unintentionally turned on.

12 Claims, 12 Drawing Sheets

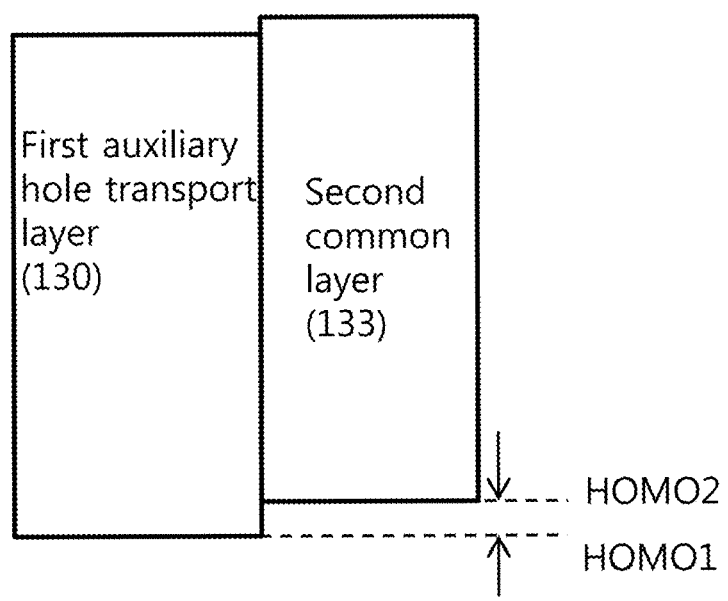

ORGANIC LIGHT-EMITTING DISPLAY DEVICE

CROSS-REFERENCE TO RELATED APPLICATION

This application claims the benefit of Korean Patent Application No. 10-2016-0184421, filed on Dec. 30, 2016, the disclosure of which is incorporated herein by reference into the present application.

BACKGROUND OF THE INVENTION

Field of the Invention

The present invention relates to an organic light-emitting display device, and more particularly to an organic light-emitting display device, which is capable of preventing current leakage to an adjacent sub-pixel due to a common layer having high hole mobility.

Discussion of the Related Art

Recently, with the arrival of the information age, the field of displays for visually displaying electrically conveyed information signals has developed rapidly. In response to this, various kinds of flat panel display devices having excellent characteristics, such as a small thickness, a low weight, and low power consumption, have been developed and have rapidly replaced existing cathode ray tubes (CRTs).

Representative examples of such flat panel display devices may include a liquid crystal display (LCD) device, a plasma display panel (PDP) device, a field emission display (FED) device, and an organic light-emitting display (OLED) device.

Among these, the organic light-emitting display device is considered to have a competitive application because it does not require a separate light source and enables the realization of a compact device design and vivid color display.

The organic light-emitting display device includes organic light-emitting elements, which are independently driven on a per-sub-pixel basis. Such an organic light-emitting element includes an anode, a cathode, and a plurality of organic layers between the anode and the cathode.

The organic layers include a hole injection layer, a hole transport layer, an organic light-emitting layer, and an electron transport layer, which are sequentially disposed from the anode. Among these, the organic light-emitting layer substantially functions to emit light as the energy of excitons, produced via the combination of holes and electrons, falls down to the ground state. The other layers function to assist in the transport of holes or electrons to the organic light-emitting layer.

In addition, in the organic light-emitting display device, for color display, sub-pixels are divided into red, green, and blue sub-pixels, and on a per-sub-pixel basis, an organic light-emitting layer having the color of a corresponding sub-pixel is formed. Generally, deposition using a shadow mask is used to form the organic light-emitting layer.

However, when the shadow mask has a large area, the shadow mask may droop due to the weight thereof, and thus may cause deterioration in a yield rate when used repeatedly. Therefore, the other organic layers excluding the light-emitting layer are continuously formed in common in the respective sub-pixels without the shadow mask.

However, since current may flow laterally through the resulting common layer of the sub-pixels that is continuously formed in a plane, lateral current leakage may occur.

FIG. 1 is a sectional view illustrating the effect of lateral current leakage in an organic light-emitting display device of a related art, and FIG. 2 is a graph showing the light intensity in accordance with wavelength upon low-gradation blue driving in the organic light-emitting display device of a related art.

Considering one form of the organic light-emitting display device of a related art, as illustrated in FIG. 1, in each sub-pixel on a substrate 10, a first electrode 11, a bank 12, which is superimposed on the edge of the first electrode 11 and defines an emission portion, and a hole injection layer 13 and a hole transport layer 14, which cover the first electrode 11 and the bank 12, are formed in sequence. In addition, light-emitting layers 16 and 17, an electron transport layer 18, and a second electrode 19 are formed thereabove in sequence.

In addition, in a red sub-pixel, in which a light-emitting area between the first and second electrodes 11 and 19 is formed higher than those of other sub-pixels according to resonance conditions, in order to match this light emission height, an auxiliary hole transport layer 15 may be further provided between the hole transport layer 14 and the red light-emitting layer 16. The position of a light-emitting layer at which the maximum wavelength is obtained may be differently set between the first and second electrodes 11 and 19 for each color of light. A red light-emitting layer may be located at the highest height, a green light-emitting layer may be located at the second-highest height, and a blue light-emitting layer may be located at the lowest height. Accordingly, a green sub-pixel may further include an auxiliary hole transport layer between the hole transport layer and the green light-emitting layer, and the auxiliary hole transport layer provided in the green sub-pixel may be thinner than the auxiliary hole transport layer 15 provided in the red sub-pixel.

However, as illustrated in FIG. 1, in the organic light-emitting display device of the related art, upon low-gradation blue driving, a phenomenon in which an adjacent red sub-pixel is also turned on occurs. This is a phenomenon in which, although a voltage is applied between the first electrode and the second electrode of only a blue sub-pixel in order to emit pure blue light, current, which flows through a vertical electric field between the first electrode (anode) and the second electrode (cathode) of the blue sub-pixel, which is turned on, leaks laterally through a common layer, causing an adjacent sub-pixel to be turned on. The lateral current leakage, in particular, is clearly visible in a low-gradation display, as shown in FIG. 2. This is because, when current, which horizontally flows in the blue sub-pixel, flows laterally to common organic layers, the adjacent red sub-pixel, which is in an off state, acts as if it were turned on. In this case, color purity may be deteriorated, and the display of pure blue gradation is difficult.

This is because the driving voltage required for red lighting is lower than the driving voltage required for blue lighting, and therefore, a similar emitting effect is caused even by a small amount of leakage current. This phenomenon results in a defect in which unintentional light emission from sub-pixels of other colors is observed upon low-gradation blue driving.

In particular, such other color driving caused by lateral current leakage may cause color mixing in a low-gradation display, which may prevent a desired color from being normally displayed.

In addition, the lateral current leakage may have a greater effect on the adjacent sub-pixel when the hole mobility of the organic layer, which is used as a common layer, is increased.

SUMMARY OF THE INVENTION

Accordingly, the present invention is directed to an organic light-emitting display device that substantially obviates one or more problems due to limitations and disadvantages of the related art.

An object of the present invention is to provide an organic light-emitting display device, in which an auxiliary hole transport layer is provided in contact with a hole injection layer in at least one sub-pixel so as to prevent current leakage to an adjacent sub-pixel due to a common layer having high hole mobility.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

An organic light-emitting display device of the present invention is characterized in that, when a common layer, which includes a material having high hole mobility, is provided to increase the hole injection efficiency, an auxiliary hole transport layer is provided in a sub-pixel that is vulnerable to leakage current so as to be in contact with the common layer, thereby preventing the sub-pixel having the auxiliary hole transport layer from malfunctioning due to leakage current that is generated by the operation of a neighboring sub-pixel.

To achieve these objects and other advantages and in accordance with the purpose of the invention, as embodied and broadly described herein, an organic light-emitting display device includes a substrate having first to third sub-pixels, a first electrode individually provided in each of the first to third sub-pixels, a first common layer provided on the first to third sub-pixels of the substrate in order to cover the first electrodes, a first auxiliary hole transport layer provided on the first common layer in the first sub-pixel so as to be in contact with the first common layer, a second common layer covering the first auxiliary hole transport layer and the first common layer, the second common layer having a higher highest occupied molecular orbital (HOMO) energy level than the first auxiliary hole transport layer, first to third light-emitting layers respectively provided at the first to third sub-pixels so as to be disposed on the second common layer, a third common layer provided on the first to third light-emitting layers, and a second electrode provided on the third common layer.

The organic light-emitting display device may further include a fourth common layer provided between the second common layer and each of the first to third light-emitting layers. The fourth common layer may have a lower HOMO energy level than the first auxiliary hole transport layer.

The first common layer may have higher hole mobility than the first auxiliary hole transport layer and the second common layer.

The second light-emitting layer may include a host having a lower HOMO energy level than hosts of the first light-emitting layer and the third light-emitting layer.

The first auxiliary hole transport layer of the first sub-pixel and the second common layer of the second and third sub-pixels may be positioned in the same layer as each other in the horizontal direction.

When voltage is selectively applied only to the first electrode and the second electrode of the second sub-pixel, the first auxiliary hole transport layer may act as resistance at the boundary between the second sub-pixel and the first sub-pixel.

The organic light-emitting display device may further include a second auxiliary hole transport layer provided in the third sub-pixel. The second auxiliary hole transport layer may be positioned between the second common layer and the fourth common layer or between the first common layer and the second common layer. The second auxiliary hole transport layer may have a smaller thickness than the first auxiliary hole transport layer.

The first light-emitting layer may emit colored light having the longest wavelength, the third light-emitting layer may emit colored light having an intermediate wavelength, and the second light-emitting layer may emit colored light having the shortest wavelength.

The organic light-emitting display device may further include a bank provided at the boundary of each of the sub-pixels.

The first auxiliary hole transport layer may have a cut portion on the bank positioned at an adjacent portion (a marginal region) of the first sub-pixel.

The second auxiliary hole transport layer may have a cut portion on the bank positioned at an adjacent portion of the third sub-pixel.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 4 is a view showing energy band-gap properties of a first auxiliary hole transport layer and a first common layer shown in FIG. 3;

DETAILED DESCRIPTION OF THE EMBODIMENTS

Figure 1:
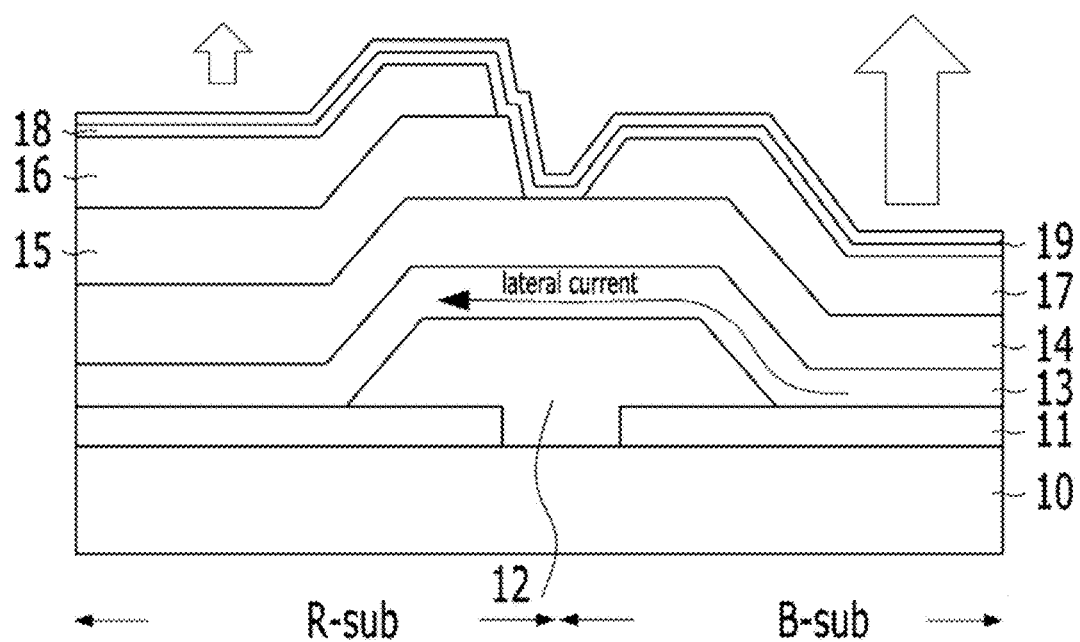
FIG. 1 is a sectional view illustrating lateral current leakage in an organic light-emitting display device of a related art.

The advantages and features of the embodiments of the present invention and the way of attaining them will become apparent with reference to embodiments described below in detail in conjunction with the accompanying drawings. The present invention, however, is not limited to the embodiments disclosed hereinafter and may be embodied in many different forms. Rather, these exemplary embodiments are provided so that this disclosure will be through and complete and will fully convey the scope to those skilled in the art. The scope of the present invention should be defined by the claims.

In the drawings for explaining the exemplary embodiments of the present invention, for example, the illustrated shape, size, ratio, angle, and number are given by way of example, and thus, are not limited to the disclosure of the present invention. Throughout the present specification, the same reference numerals designate the same constituent elements. In addition, in the following description of the present invention, a detailed description of known functions and configurations incorporated herein will be omitted when it may make the subject matter of the present invention rather unclear. The terms "comprises," "includes," and/or "has", used in this specification, do not preclude the presence or addition of other elements unless used along with the term "only". The singular forms are intended to include the plural forms as well, unless the context clearly indicates otherwise.

In the interpretation of constituent elements included in the various embodiments of the present invention, the constituent elements are interpreted as including an error range even if there is no explicit description thereof.

In the description of the various embodiments of the present invention, when describing positional relationships, for example, when the positional relationship between two parts is described using "on", "above", "below", "next to", or the like, one or more other parts may be located between the two parts unless the term "directly" or "closely" is used.

In the description of the various embodiments of the present invention, when describing temporal relationships, for example, when the temporal relationship between two actions is described using "after", "subsequently", "next", "before", or the like, the actions may not occur in succession unless the term "directly" or "just" is used therewith.

In the description of the various embodiments of the present invention, although terms such as, for example, "first" and "second" may be used to describe various elements, these terms are merely used to distinguish the same or similar elements from each other. Therefore, in the present specification, an element indicated by "first" may be the same as an element indicated by "second" without exceeding the technical scope of the present invention, unless otherwise mentioned.

The respective features of the various embodiments of the present invention may be partially or wholly coupled to and combined with each other, and various technical linkages and modes of operation thereof are possible. These various embodiments may be performed independently of each other, or may be performed in association with each other.

In this specification, the "lowest unoccupied molecular orbital (LUMO) energy level" and the "highest occupied molecular orbital (HOMO) energy level" of any layer mean the LUMO energy level and the HOMO energy level of the material that occupies the greatest weight percentage of the corresponding layer, for example, a host material, unless they are referred to as the LUMO energy level and the HOMO energy level of a dopant material that is doped in the corresponding layer.

In general, the ground state of an organic molecule is referred to as a "HOMO energy level", and the excited state thereof is referred to as a "LUMO energy level". The "HOMO energy level" and the "LUMO energy level" are defined as potential values relative to the vacuum level. Considering the vacuum level is 0 eV, "LUMO energy level" and "HOMO energy level", which are below the vacuum level, are measured as negative values. Therefore, when the LUMO energy level or the HOMO energy level of a certain material is compared with that of another material, the expression "lower" means that the energy level is further from the vacuum level but that the absolute value is higher. For example, if the LUMO energy level of one material is −2.5 eV and the LUMO energy level of another material is −2.7 eV, it means that the latter has a lower LUMO energy level and the former has a higher LUMO energy level. In the organic light-emitting display device of the present invention, "LUMO energy level" and "HOMO energy level" may be energy levels measured by a cyclic voltammetry (CV) method that determines the energy level from a potential value relative to a reference electrode, the potential value of which is known.

In this specification, the term "doped" means that a material of any layer having physical properties (e.g., N-type and P-type, or an organic material and an inorganic material) different from the material that occupies the greatest weight percentage of the corresponding layer is added to the material accounting for the greatest weight percentage in an amount corresponding to a weight percentage of less than 10%. In other words, a "doped" layer means a layer in which a host material and a dopant material of any layer are distinguishable from each other in consideration of the weight percentages thereof. In addition, the term "undoped" refers to all cases excluding the case that corresponds to the term "doped". For example, when any layer is formed of a single material or is formed of a mixture of materials having the same or similar properties, the layer is considered an "undoped" layer. In another example, when at least one of constituent materials of any layer is of a p-type and all of the other constituent materials of the layer are not of an N-type, the layer is considered an "undoped" layer. In another example, when at least one of the constituent materials of any layer is an organic material and all of the other constituent materials of the layer are not an inorganic material, the layer is considered an "undoped" layer. In another example, when all constituent materials of any layer are organic materials, at least one of the constituent materials is of an N-type, at least another constituent material is of a P-type, and the weight percent of the N-type material is less than 10% or the weight percent of the P-type material is less than 10%, the layer is considered a "doped" layer.

Figure 3:
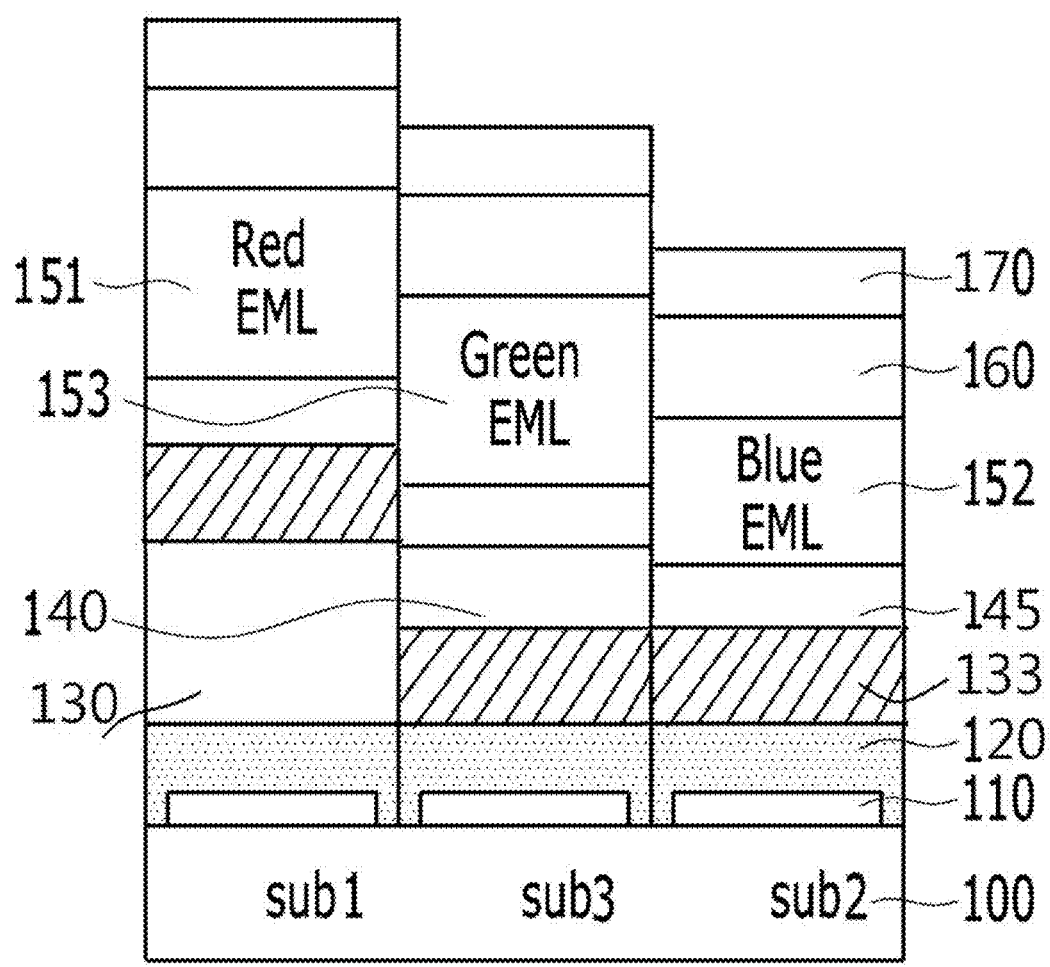
FIG. 3 is a sectional view schematically illustrating an organic light-emitting display device according to a first embodiment of the present invention.
Figure 5A:
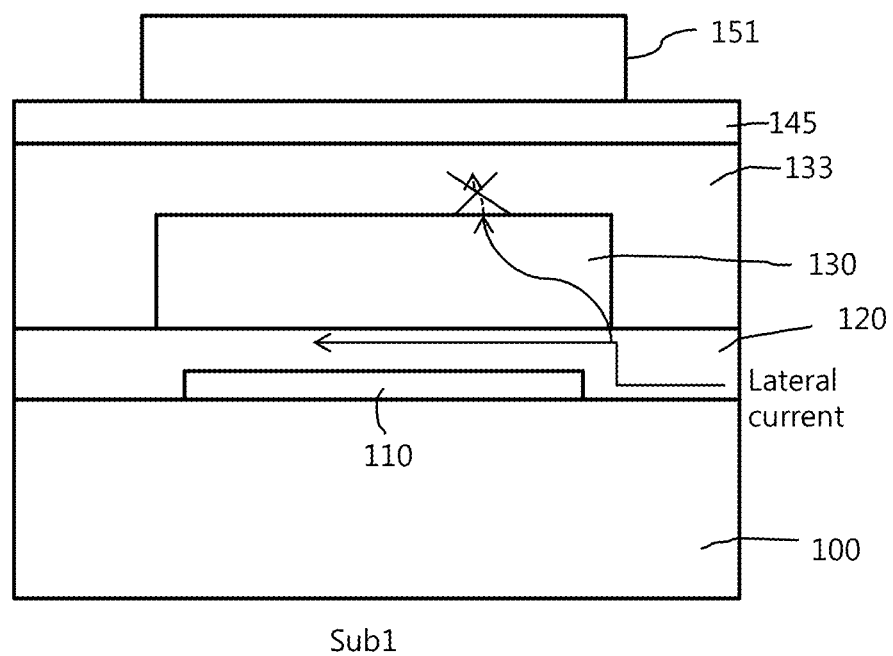
FIGS. 5A and 5B are sectional views respectively showing current flow in a neighboring first sub-pixel and third sub-pixel during the operation of a second sub-pixel.
Figure 5B:
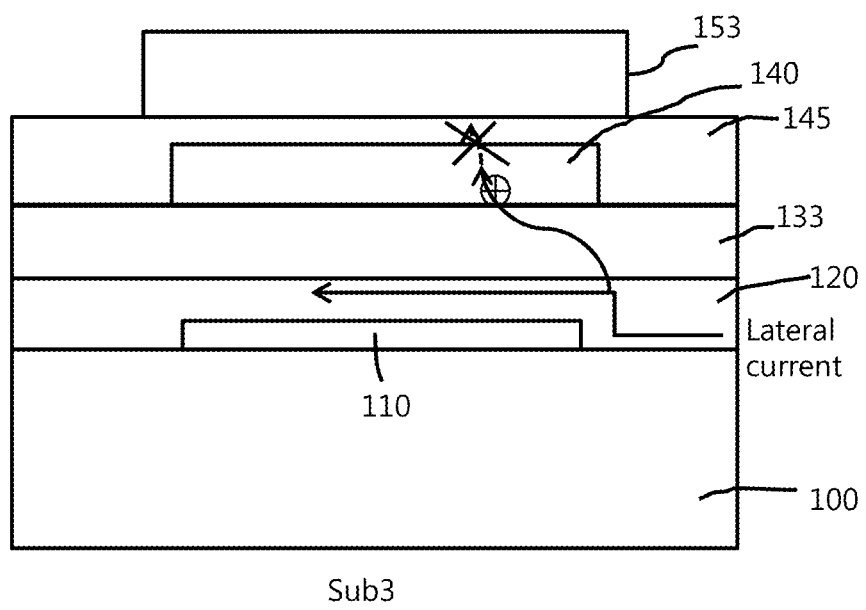

FIG. 3 is a sectional view schematically illustrating an organic light-emitting display device according to a first embodiment of the present invention. FIG. 4 is a view showing energy band-gap properties of a first auxiliary hole transport layer and a first common layer shown in FIG. 3. FIGS. 5A and 5B are sectional views respectively showing current flow in a neighboring first sub-pixel and third sub-pixel during the operation of a second sub-pixel. All the components of the organic light-emitting display device according to all embodiments of the present invention are operatively coupled and configured.

As shown in FIG. 3, the organic light-emitting display device according to the present invention includes a substrate 100 having first to third sub-pixels Sub1, Sub2 and Sub3, a first electrode 110 individually provided in each of the first to third sub-pixels Sub1, Sub2 and Sub3, a first common layer 120 provided on the substrate 100 in order to cover the first electrode 110, a first auxiliary hole transport layer 130 provided on the first common layer 120 in the first sub-pixel Sub1 so as to be in contact with the first common layer 120, a second common layer 133 provided to cover the first auxiliary hole transport layer 130 and the first common layer 120, the second common layer 133 having a higher HOMO energy level than a HOMO energy level of the first auxiliary hole transport layer, first to third light-emitting layers 151, 152 and 153 respectively provided at the first to third sub-pixels Sub1, Sub2 and Sub3 so as to be disposed on the second common layer 133, a third common layer 160 provided on the first to third light-emitting layers 151, 152 and 153, and a second electrode 170 provided on the third common layer 160.

The first electrode 110 is an anode, which is formed of a transparent conductive material such as, for example, transparent conductive oxide (TCO). Examples of the TCO may include indium-tin-oxide (ITO) and indium-zinc-oxide (IZO).

The second electrode 170 is a cathode, which is formed of a reflective metal material such as, for example, gold (Au), aluminum (Al), molybdenum (Mo), chromium (Cr) or copper (Cu), or a semi-permeable material such as, for example, an MgAg alloy. Even when a reflective metal is used, it may exhibit semi-permeability through thickness adjustment. The selection of the first electrode and the second electrode may be determined in accordance with the efficiency of injecting holes or electrons into the organic element and the manner of light emission (top emission or bottom emission).

The first common layer 120 is a kind of hole injection layer (HIL), which is formed of a material that has a HOMO energy level that is similar to the work function of the first electrode 110 so that hole injection from the metal forming the first electrode 110 into the organic element between the first electrode 110 and the second electrode 170 is facilitated. When holes are injected into the first common layer 120, which is formed of an organic material, from the first electrode 110, which is formed of a metal or transparent metal material, a large stress is applied at the interface. Therefore, the first common layer 120 includes a p-type dopant in order to reduce the stress and assist in the injection of holes. Accordingly, in the layer structure between the first electrode 110 and the light-emitting layers 151, 152 and 153, the first common layer 120 has the highest hole mobility.

The second common layer 133 serves to transfer the holes supplied through the first common layer 120 to the light-emitting layers 151, 152 and 153, and is formed of a material that prevents carriers, which move when the electric field is generated between the first electrode 110 and the second electrode 170, from reacting to internal materials.

Meanwhile, according to the organic light-emitting display device of the present invention, in the first sub-pixel, the first auxiliary hole transport layer 130 is selectively formed directly before the formation of the second common layer 133. The first auxiliary hole transport layer 130 is provided to adjust the optical distance of the first light-emitting layer 151, and the thickness of the first auxiliary hole transport layer 130 is adjusted in accordance with the wavelength of the light emitted from the first light-emitting layer 151. Further, the first auxiliary hole transport layer 130 functions to transport holes. Because the first common layer 120, the second common layer 133 and the fourth common layer 145 as well as the first auxiliary hole transport later 130 are provided between the first electrode 110 and the first light-emitting layer 151, the optical distance of the first light-emitting layer 151 may be determined by the combination of the hole-transport-related layers provided between the first electrode 110 and the first light-emitting layer 151. However, because the first common layer 120, the second common layer 133 and the fourth common layer 145 are provided in each of the sub-pixels in common and have the same thickness as those provided in each of the other sub-pixels, the color of light emitted from the first sub-pixel is adjusted by the first auxiliary hole transport layer 130.

Further, the first auxiliary hole transport layer 130 is positioned in contact with the first common layer 120 having the high hole mobility, and functions to capture and trap the carriers caused by lateral leakage current that flows to the first common layer 120. To this end, as shown in FIG. 4, the first auxiliary hole transport layer 130 is formed of a hole-transporting material having a lower HOMO energy level than that of the second common layer 133, which is positioned in each of the other sub-pixels, which are arranged horizontally.

Because the holes are vertically transferred through the first common layer 120, the first auxiliary hole transport layer 130, the second common layer 133, the fourth common layer 145 and the first light-emitting layer 151 in that order, the first auxiliary hole transport layer 130 is formed of a material having a HOMO energy level that is lower than the HOMO energy level of the second common layer 133 by an amount within a range from 0.15 eV to 0.30 eV in order to capture the carriers caused by leakage current, but having a higher HOMO energy level than that of the fourth common layer 145 in order to ensure normal hole transport when an electric field is applied between the first electrode 110 and the second electrode 170 in the first sub-pixel. In an example, the HOMO energy level of the second common layer 133 may be −5.18 eV, the HOMO energy level of the first auxiliary hole transport layer 130 may be −5.4 eV, and the HOMO energy level of the fourth common layer 145 may be −5.5 eV. The above-proposed examples of the HOMO energy level are merely illustrative, and if the material of the second common layer 133 is changed and the HOMO energy level thereof is thus changed, the material of the first auxiliary hole transport layer 130 may also be changed to a material having a HOMO energy level that is lower than the new HOMO energy level of the second common layer 133 by an amount within a range from 0.15 eV to 0.30 eV.

The fourth common layer 145 functions to prevent excitons or electrons from moving from the light-emitting layers 151, 152 and 153 to the second common layer 133, which is disposed thereunder, thereby preventing deterioration of the second common layer 133. However, the fourth common layer 145 may be omitted as needed.

Specifically, the fourth common layer 145 functions to prevent electrons or excitons from escaping from the first to third light-emitting layers 151, 152 and 153 so that the excitons or electrons are restricted within the light-emitting layers 151, 152 and 153. The fourth common layer 145 is disposed between the first electrode 110 and each of the light-emitting layers 151, 152 and 153 so as to be in direct contact with the light-emitting layers 151, 152 and 153, and has a LUMO energy level that is different from the LUMO energy level of the materials (an n-type host when a plurality of hosts is included) of the electron-blocking layer 145 and the light-emitting layers 151, 152 and 153.

The third sub-pixel may further include a second auxiliary hole transport layer 140, which is disposed between the second hole transport layer 133 and the fourth common layer 145.

The second auxiliary hole transport layer 140 may be formed so as to have a smaller thickness than the first auxiliary hole transport layer 130 and to enable the third light-emitting layer 153 between the first electrode 110 and the second electrode 170 to have a proper optical distance.

The longer the wavelength of the color of light emitted from the light-emitting layer, the longer the optical distance is required to be. For example, if the sub-pixels emit red light, green light and blue light, the optical distance of the red sub-pixel is required to be the longest, and the optical distance of the blue sub-pixel is required to be the shortest. Therefore, if the first sub-pixel is a red sub-pixel, the second sub-pixel is a blue sub-pixel and the third sub-pixel is a green sub-pixel, the thickness of the first auxiliary hole transport layer provided in the first sub-pixel may be greater than the thickness of the second auxiliary hole transport layer provided in the third sub-pixel, and the second sub-pixel may not include an additional auxiliary hole transport layer for compensating for an optical direction.

In the organic light-emitting display device of the present invention, the reason why the first auxiliary hole transport layer 130 is in contact with the first common layer 120 is to make the first auxiliary hole transport layer 130 primarily act as resistance to a portion of the leakage current transferred laterally via the first common layer 120, having high hole mobility and conductivity in the sub-pixel that is vulnerable to leakage current, thereby blocking upward flow of the current and consequently preventing the first light-emitting layer 151 of the first sub-pixel from emitting light unintentionally.

The sub-pixel that is vulnerable to leakage current is a sub-pixel that requires a lower driving voltage than sub-pixels of other colors and thus emits light even in response to leakage current, without the application of voltage to the first electrode thereof.

As described above with reference to FIGS. 1 and 2, when the driving voltage required for light emission of the blue sub-pixel is relatively high and the driving voltage required for light emission of the red sub-pixel is relatively low, in the case of a structure having no auxiliary hole transport layer, the leakage current transferred laterally via the first common layer 120 is transferred to all of the sub-pixels and is also transferred to the layers arranged vertically in each of the sub-pixels, causing unintentional light emission of the sub-pixels due to leakage current.

The organic light-emitting display device of the present invention is constructed, for example, such that the sub-pixel having a relatively high driving voltage is set to a blue sub-pixel and the sub-pixels having lower driving voltages than the blue sub-pixel are set to sub-pixels of other colors. The reason for this driving voltage difference is that the HOMO energy level of the main material (a host) of the blue light-emitting layer is lower than the HOMO energy level of the main material (a host) of the other colored light-emitting layers and accordingly the difference between the voltages applied to the first electrode and the second electrode for operation thereof is large.

Such a driving voltage difference is caused by the material of the light-emitting layer. If the material of the light-emitting layer is changed, the driving voltage required for each of the sub-pixels may be changed. However, light-emitting materials developed to date have mutually different band-gap properties, and in particular, a blue light-emitting material has a poor brightness property. Therefore, there is a limitation in that the driving voltage required for the blue sub-pixel is relatively high. The structure between the first electrode and the second electrode of the present invention is determined on the basis of this phenomenon. Although the example illustrated is configured such that the first sub-pixel is a red sub-pixel, the second sub-pixel is a blue sub-pixel and the third sub-pixel is a green sub-pixel, if the sub-pixel that is unintentionally turned on by lateral leakage current is a sub-pixel of another color, the first auxiliary hole transport layer may be applied to the sub-pixel that has this problem.

As shown in FIG. 5A, the first auxiliary hole transport layer 130 of the present invention is positioned on the first common layer 120 in the vertical direction and is positioned in the same layer as the second common layer 133, disposed in each of the other sub-pixels, in the horizontal direction. Further, the first auxiliary hole transport layer 130 is in contact with the first common layer 120 and captures carriers caused by leakage current so that the leakage current cannot be transferred any further upwards, thereby primarily preventing the first sub-pixel from unintentionally emitting light due to the leakage current. The second common layer 133 having a hole transport function is positioned on the first auxiliary hole transport layer 130. When a normal strong vertical current (a current that flows from the first electrode to the second electrode) flows in the first sub-pixel, holes are normally transferred to the first light-emitting layer 151 via the first common layer 120, the first auxiliary hole transport layer 130, the second common layer 133 and the fourth common layer 145 without capturing the holes in a specific layer. To this end, the HOMO energy level difference between the first auxiliary hole transport layer 130 and the second common layer 133 does not exceed 0.30 eV.

As shown in FIG. 5B, in the third sub-pixel, since the second common layer 133 is positioned directly on the first common layer 120, although vertical current flow from the first common layer 120 and the second common layer 133 occurs due to leakage current, the carriers caused by the leakage current are captured by the second auxiliary hole transport layer 140, which has a lower HOMO energy level than the second common layer 133, thereby preventing the carriers caused by the leakage current from being transferred upwards to the third light-emitting layer 153 and consequently preventing unintentional light emission.

The electron transport layer 160 supplies electrons from the second electrode 170 to the light-emitting layer 150.

Herein, among the organic material layers and the electron injection layer, which are provided between the first electrode 110 and the second electrode 170, the layers other than the light-emitting layer 151, 152 and 153 may be continuously formed in common without distinction between the sub-pixels. On the other hand, the light-emitting layer 151, 152 and 153 is individually formed in each of the sub-pixels.

When the substrate 100 includes an active area, which is defined in the center portion thereof and has a plurality of sub-pixels, and a dead area, which is defined around the active area, in the plane thereof, the first common layer 120, the second common layer 133, the fourth common layer 145 and the third common layer 160 are continuously formed in common at least in the active area. If these common layers are individually formed in each of the sub-pixels, additional deposition masks are required for each layer, which reduces production yield. Therefore, layers having common functions between the sub-pixels are continuously formed in common without distinction between the sub-pixels and are formed without using a deposition mask. In the dead area, the common layers may be omitted, or the common layers may be removed from the dead area using a single mask.

The first common layer 120, the second common layer 133, the fourth common layer 145 and the first and second auxiliary hole transport layers 130 and 140 include a hole-transporting material serving as a host material. Holes are selectively introduced into the first common layer 120 from the first electrode 110, and the first common layer 120 includes a p-type dopant in order to reduce the stress generated at that time. The fourth common layer 145 includes a material that has a higher LUMO energy level than the LUMO energy levels of the light-emitting layers 151, 152 and 153 so as to prevent electrons or excitons from escaping from the light-emitting layers 151, 152 and 153. Further, the fourth common layer 145 includes a hole-transporting material that has a lower HOMO energy level than the HOMO energy levels of the first auxiliary hole transport layer 130 and the second common layer 133, thereby achieving normal hole transport. The first common layer 120 and the fourth common layer 145 are the layers, the main functions of which are to assist in the injection of holes and to block electrons or excitons and which have a thickness of 100 Å or lower so as to have no influence on the hole transport.

Figure 2:
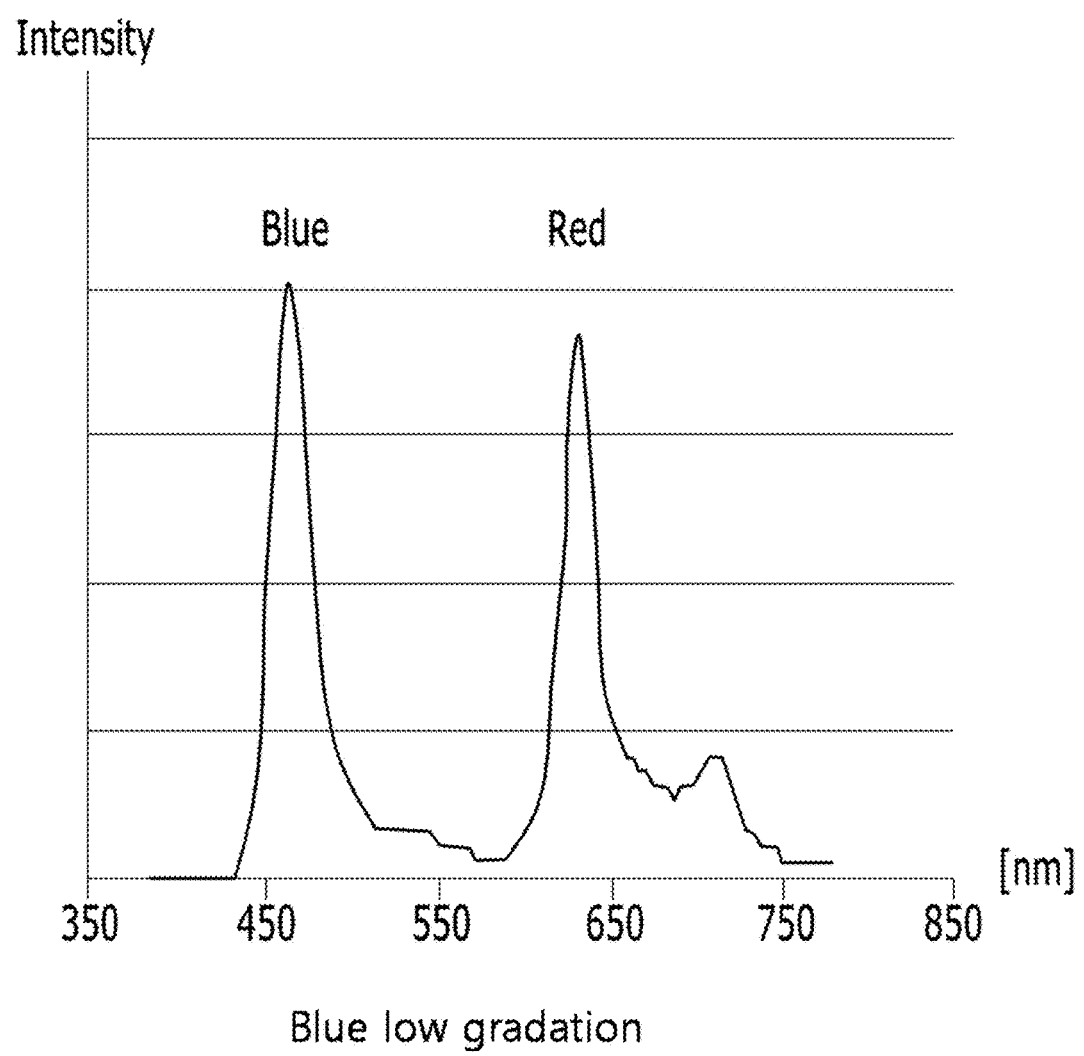
FIG. 2 is a graph showing the light intensity in accordance with wavelength upon low-gradation blue driving in the organic light-emitting display device of a related art.

The second common layer 133 and the first and second auxiliary hole transport layers 130 and 140 may be formed of materials that have the same framework but differ in substituents and thus differ in HOMO energy levels. For example, these materials may be aromatic amine. However, the materials that form the second common layer 133 and the first and second auxiliary hole transport layers 130 and 140 are not limited to aromatic amine or materials having the same framework, but materials that differ in HOMO energy levels, as shown in FIG. 2, among hole-transporting materials may be selected as materials of the second common layer 133 and the first and second auxiliary hole transport layers 130 and 140.

Meanwhile, the third common layer 160 is an electron transport layer that is provided on each of the light-emitting layers 151, 152 and 153 in common and transports electrons introduced into the second electrode 170 to each of the light-emitting layers 151, 152 and 153.

There may be further provided an electron injection layer between the third common layer 160 and the second electrode 170 as needed.

Hereinafter, the concrete planar structure and cross-sectional structure of the organic light-emitting display device according to the present invention, including the boundary of each of the sub-pixels, will be described.

Figure 6:
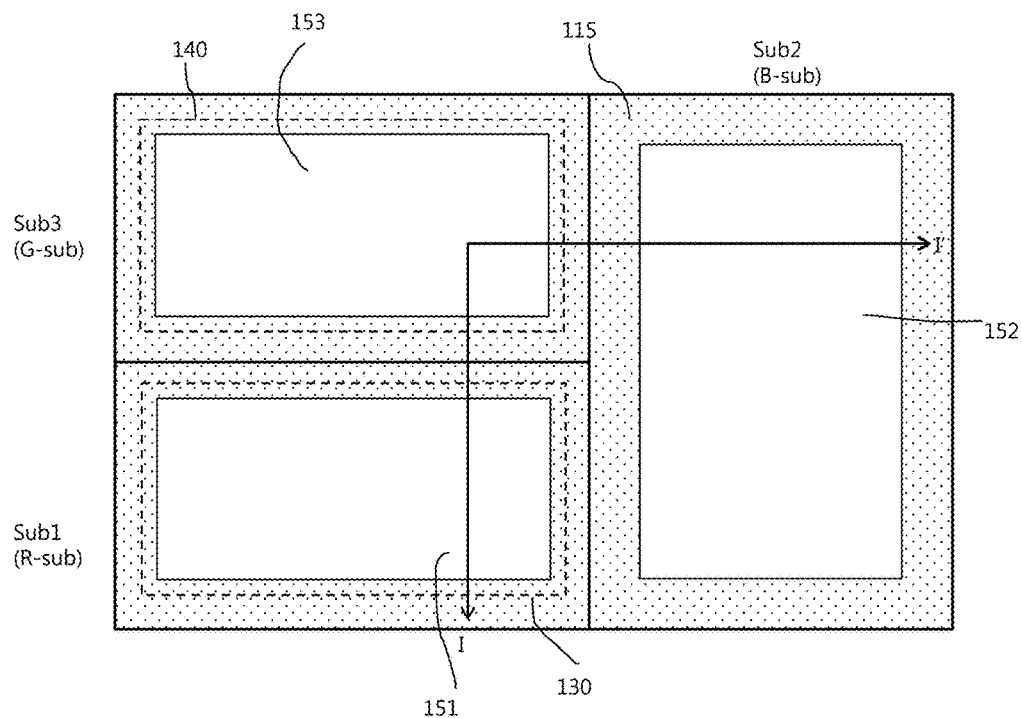
FIG. 6 is a plan view illustrating one pixel of the organic light-emitting display device according to an embodiment of the present invention.
Figure 7:
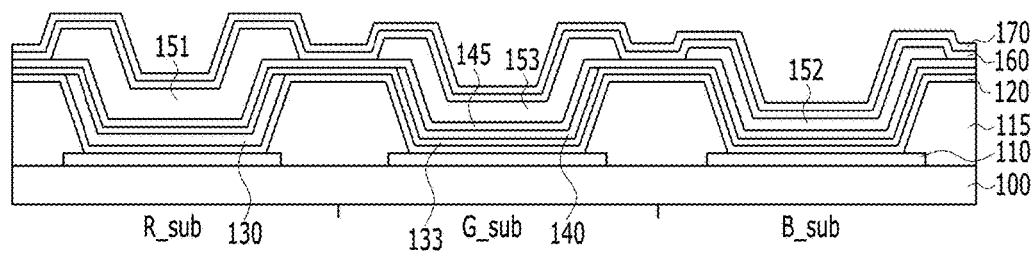
FIG. 7 is a sectional view taken along line I-I' in FIG. 6.

FIG. 6 is a plan view illustrating one pixel of the organic light-emitting display device according to the present invention, and FIG. 7 is a sectional view taken along line I-I' in FIG. 6.

The pixel of the organic light-emitting display device shown in FIGS. 6 and 7 is structured such that a red sub-pixel, a green sub-pixel and a blue sub-pixel are arranged adjacent to one another. The blue sub-pixel has a longer vertical length than the red sub-pixel and the green sub-pixel; in particular, the vertical length of the blue sub-pixel is the same as the sum of the vertical length of the red sub-pixel and the vertical length of the green sub-pixel. The red sub-pixel, the green sub-pixel and the blue sub-pixel are formed so as to have mutually different areas. This structure is merely illustrative, and the red sub-pixel, the green sub-pixel and the blue sub-pixel may be formed so as to have the same area. However, when the blue light-emitting layer provided in the blue sub-pixel has a relatively low efficiency, the illustrated structure may be effective in compensating for the low efficiency.

In addition to the structure schematically described above, the organic light-emitting display device shown in FIGS. 6 and 7 further includes a bank 115 for defining an emission portion of each of the light-emitting layers 151, 152 and 153 of the sub-pixels. The bank 115 may have a structure such as a spacer provided thereon, or may be omitted when the emission portion is formed in a concave shape in the substrate 100.

Meanwhile, although the substrate 100 is illustrated as having a plate shape, a thin-film transistor (TFT) array is provided under the first electrode 110. The first electrode 110 of each of the sub-pixels is connected to at least one thin-film transistor. A thin-film transistor having a well-known structure may be used, and the illustration of the structure thereof will be omitted because the organic light-emitting display device according to the present invention is characterized by the structure of the light-emitting elements.

The substrate 100 may be a glass substrate or a plastic substrate. In the case of a plastic substrate, it may be formed so as to have a thickness ranging from several micrometers (μm) to tens of micrometers (μm) and to be ductile and transparent.

The above-described first sub-pixel is defined as a red sub-pixel (R-Sub), the second sub-pixel is defined as a blue sub-pixel (B-Sub), and the third sub-pixel is defined as a green sub-pixel (G-Sub).

Compared with the structure described with reference to FIGS. 3 to 5B, the structure shown in FIGS. 6 and 7 has a difference in that a bank 115 is present. Accordingly, the first common layer 120, the second common layer 133 and the fourth common layer 145 are formed on the side portion and the upper portion of the bank 115 as well as the emission portion of each of the sub-pixels.

Further, the first auxiliary hole transport layer 130, which is selectively provided in the first sub-pixel (the red sub-pixel), is formed on the flat upper portion of the first common layer 120 that is positioned on the first electrode 110 and is also formed on the portion of the first common layer 120 that is positioned on the side portion of the bank 115, which defines the emission portion of the first sub-pixel. Depending on the embodiment, the horizontal and vertical widths of the first auxiliary hole transport layer 130 may extend so as to cover the entire upper portion of the bank 115 that is positioned in the first sub-pixel, or may further extend to regions just before overlapping the emission portions of the second and third sub-pixels arranged adjacent to the first sub-pixel. In this case, when voltage is selectively supplied only to the first electrode and the second electrode of the second sub-pixel (the blue sub-pixel) and current is therefore supplied only to the same, the first auxiliary hole transport layer 130 may act as resistance at the boundary between the second sub-pixel and the first sub-pixel. That is, the first auxiliary hole transport layer 130 captures carriers caused by a component, which flows upwards in the first sub-pixel, of the leakage current, which is transferred from the second sub-pixel via the first common layer 120 in the horizontal direction, thereby preventing unintentional light emission from the first light-emitting layer 151. As a result, pure gradation display of the second sub-pixel may be possible, color mixing may be prevented, and the color purity of the organic light-emitting display device may be improved.

The second auxiliary hole transport layer 140 is formed of the same material and has the same function as the first auxiliary hole transport layer 130 because it functions to adjust the optical distance of the third light-emitting layer 153. However, because the optical distance of the third light-emitting layer 153 is different from the optical distance of the first light-emitting layer 151, which is adjusted by the first auxiliary hole transport layer 130, the second auxiliary hole transport layer 140 has a different thickness from the first auxiliary hole transport layer 130. Specifically, because the wavelength of the light emitted from the third sub-pixel is relatively short, the second auxiliary hole transport layer 140 has a smaller thickness than the first auxiliary hole transport layer 130.

In the planar structure, the first auxiliary hole transport layer 130 has a cut portion on the bank 115 that is positioned at the marginal portion of the first sub-pixel. That is, the first auxiliary hole transport layer remains only within the cut portion, and is not present beyond the cut portion.

Similarly, the second auxiliary hole transport layer 140 has a cut portion on the bank 115 that is positioned at the marginal portion of the third sub-pixel. That is, the second auxiliary hole transport layer remains only within the cut portion, and is not present beyond the cut portion.

The experiment to be described below shows the results of measuring the light intensity in accordance with wavelength when the HOMO energy level difference between the material of the first auxiliary hole transport layer 130 and the material of the second common layer is changed. Based on the experimental results, the change of leakage current in accordance with the material of the first auxiliary hole transport layer will be described.

TABLE 1

| Classification | HOMO energy level (eV) | LUMO energy level (eV) | Band gap |
|---|---|---|---|
| 1st Experimental Example | −5.2 | −2.1 | 3.1 |
| 2nd Experimental Example | −5.3 | −2.2 | 3.1 |
| 3rd Experimental Example | −5.4 | −2.4 | 3.0 |
| 4th Experimental Example | −5.5 | −2.4 | 3.1 |
| 5th Experimental Example | −5.6 | −2.4 | 3.2 |

Figure 8:
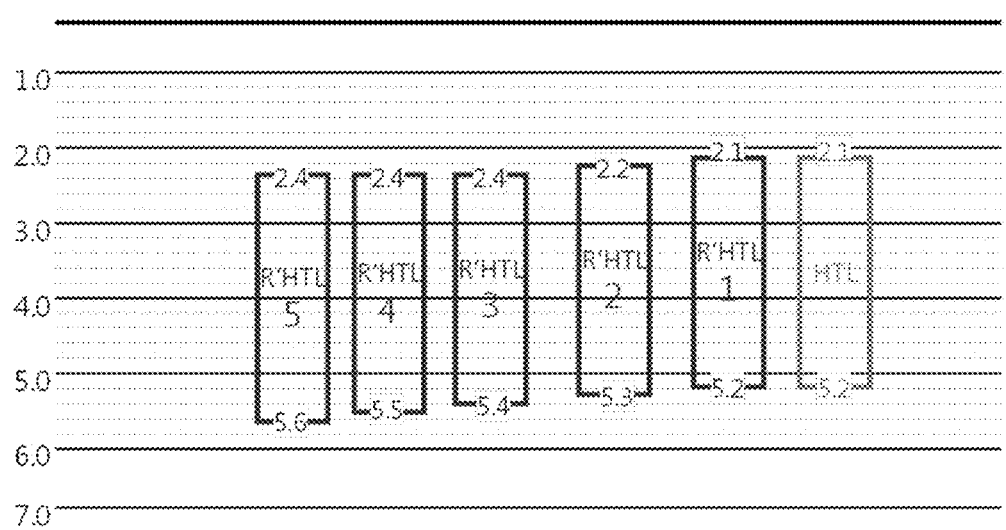
FIG. 8 is a view showing the comparison between the band gap of the first auxiliary hole transport layer and the band gap of the first common layer in each of first to fifth experimental examples, which are applied to the organic light-emitting display device according to the first embodiment of the present invention.
Figure 9:
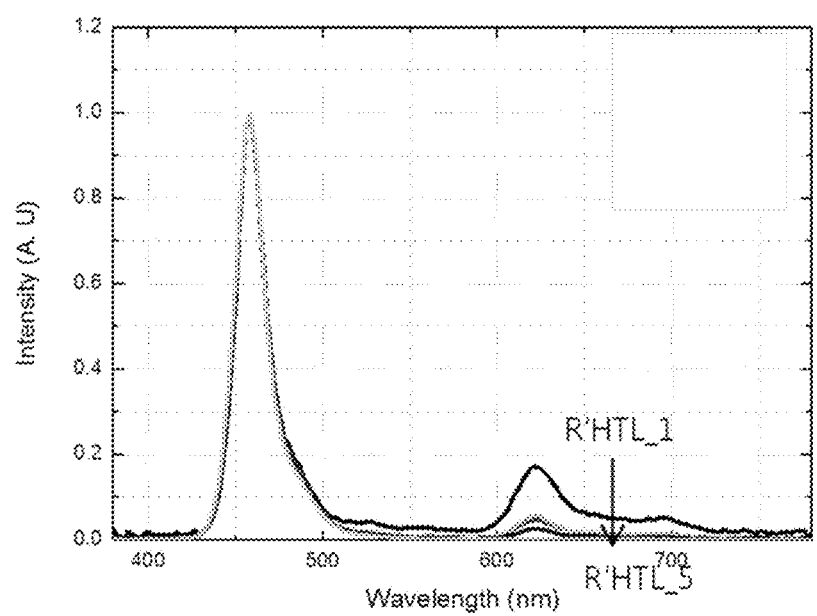
FIG. 9 is a graph showing the light intensity in accordance with wavelength when the first to fifth experimental examples in FIG. 8 are applied to the present invention.

FIG. 8 is a view showing the comparison between the band gap of the first auxiliary hole transport layer and the band gap of the first common layer in each of first to fifth experimental examples R'HTL_1, R'HTL_2, R'HTL_3, R'HTL_4 and R'HTL_5, which are applied to the organic light-emitting display device according to the first embodiment of the present invention. FIG. 9 is a graph showing the light intensity in accordance with wavelength when the first to fifth experimental examples in FIG. 8 are applied to the present invention.

It can be verified from FIG. 9 that red light emission due to leakage current is further prevented as a material having a lower HOMO energy level is used, i.e. from the first experimental example to the fifth experimental example.

In particular, like the first experimental example, when the first auxiliary hole transport layer is formed of the same material as the second common layer (the hole transport layer), it can be clearly verified that red light emission due to leakage current occurs. However, when the HOMO energy level of the first auxiliary hole transport layer is at least 0.1 eV lower than the HOMO energy level of the second common layer, it can be verified that the emission of light in colors other than blue due to leakage current is greatly reduced.

Figure 10:
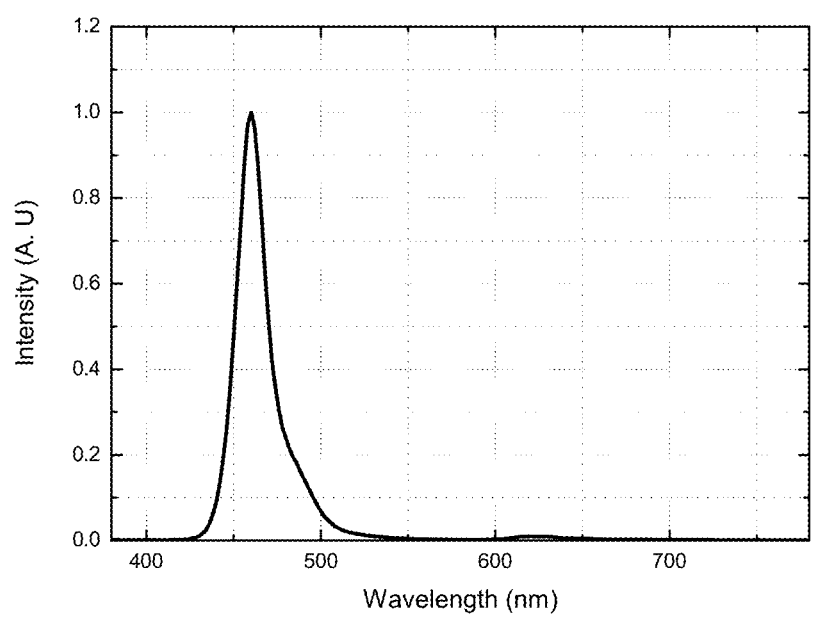
FIG. 10 is a graph showing the light intensity in accordance with wavelength in the organic light-emitting display device according to the present invention.

FIG. 10 is a graph showing the light intensity in accordance with wavelength in the organic light-emitting display device according to the present invention.

The organic light-emitting display device according to the present invention, which is indicated by the graph in FIG. 10, is structured such that the first auxiliary hole transport layer is formed of a material having a HOMO energy level that is at least 0.1 eV lower than the HOMO energy level of the second common layer but is higher than the HOMO energy level of the fourth common layer. This material may be one of the materials used in the second to fourth experimental examples shown in Table 1 and FIG. 8. For example, in the case of the fifth experimental example, if the fourth common layer (the electron-blocking layer) 145 is formed of a material having a HOMO energy level of −5.5 eV, the HOMO energy level of the first auxiliary hole transport layer 130 of the fifth experimental example is lower than that of the fourth common layer, whereby the transport of holes to the light-emitting layer may not be smoothly performed during normal operation. In order to avoid this problem, the organic light-emitting display device according to the present invention employs the first auxiliary hole transport layer 130 having the range disclosed in the second to fourth experimental examples, rather than the fifth experimental example.

The reason why a material having a higher HOMO energy level than that of the fourth common layer is used for the first auxiliary hole transport layer is to ensure the normal supply of holes to the first light-emitting layer 151 from the first electrode 110 when a normal activation current flows in the first sub-pixel. This is because, if the HOMO energy level of the first auxiliary hole transport layer is lower than that of the fourth common layer (the electron-blocking layer) 145, there may occur a problem in that holes remain in the first auxiliary hole transport layer and cannot be transferred to the first light-emitting layer 151 via the fourth common layer 145.

Figure 11:
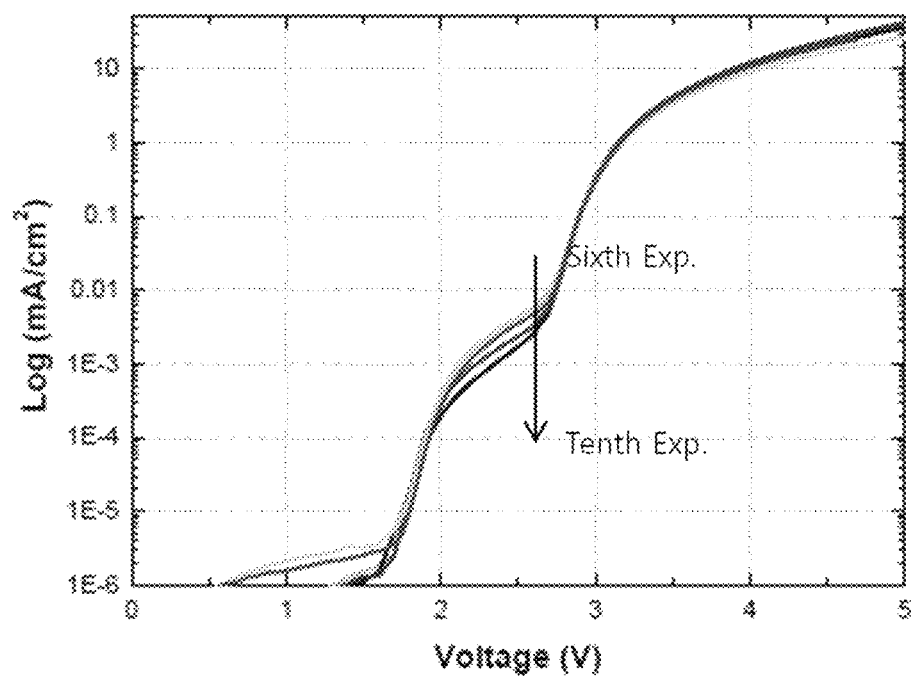
FIG. 11 is a graph showing current density in accordance with voltage on a log scale in sixth to tenth experimental examples.

FIG. 11 is a graph showing current density in accordance with voltage on a log scale in sixth to tenth experimental examples.

TABLE 2

| Classification | Structure | HOMO Energy Level (eV) of Auxiliary Hole Transport Layer |
|---|---|---|
| 6th Experimental Example | Hole Transport Layer/ Auxiliary Hole Transport Layer | −5.3 |
| 7th Experimental Example | Hole Transport Layer/ Auxiliary Hole Transport Layer | −5.4 |
| 8th Experimental Example | Auxiliary Hole Transport Layer/Hole Transport Layer | −5.2 |
| 9th Experimental Example | Auxiliary Hole Transport Layer/Hole Transport Layer | −5.3 |
| 10th Experimental Example | Auxiliary Hole Transport Layer/Hole Transport Layer | −5.4 |

The sixth to tenth experimental examples shown in Table 2 and FIG. 11 relate to current density in accordance with voltage when the deposition order of the hole transport layer and the auxiliary hole transport layer is changed. Herein, the HOMO energy level of the hole transport layer in all experimental examples is commonly set to −5.2 eV.

Referring to FIG. 11, the graph lines indicating the sixth and seventh experimental examples, in which the hole transport layer is first formed and the auxiliary hole transport layer is then formed, are located on the graph lines indicating the eighth to tenth experimental examples, in which the auxiliary hole transport layer is first formed and the hole transport layer is then formed. It can be verified that, in the structure in which the hole transport layer is first formed and the auxiliary hole transport layer is then formed, even if there is a HOMO energy level difference between the hole transport layer and the auxiliary hole transport layer, the effect of reducing leakage current is slight.

On the other hand, it can be verified that, in the structure in which the auxiliary hole transport layer is first formed and the hole transport layer is then formed, the larger the HOMO energy level difference between the auxiliary hole transport layer and the hole transport layer, the lower the current density for a given voltage.

That is, the organic light-emitting display device according to the present invention is characterized in that the hole transport layer is employed as the second common layer and in that the hole transport layer is formed after the formation of the auxiliary hole transport layer. It can be verified from the foregoing eighth to tenth experimental examples that leakage current (kink) may be reduced by the HOMO energy level difference between the auxiliary hole transport layer and the hole transport layer and that the formation order, in which the hole transport layer is formed after the formation of the auxiliary hole transport layer, is meaningful.

Meanwhile, in the graph, although the result of the eighth experimental example is not visible in the range of voltage ranging from 2V to 3V, in which kink characteristics are observed, the result of the eighth experimental example is almost the same as that of the seventh experimental example.

Figure 12:
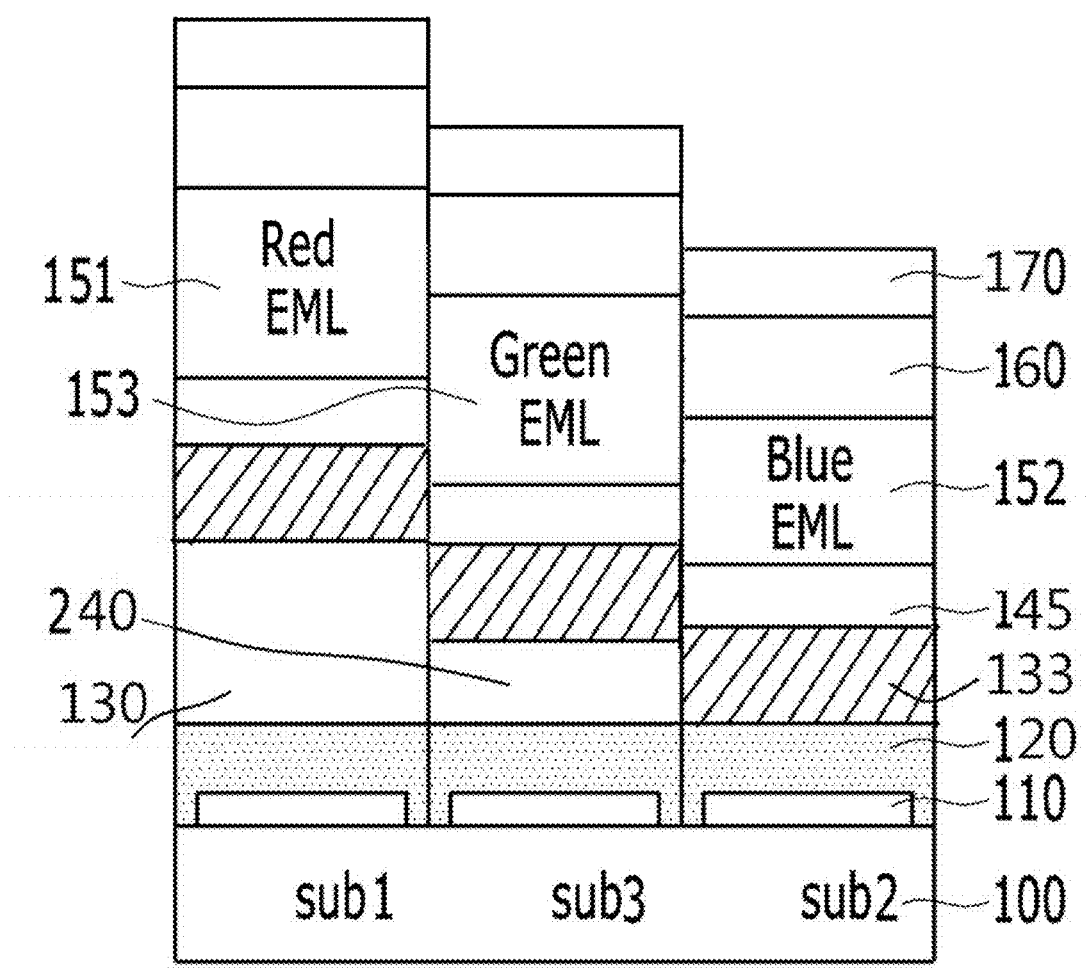
FIG. 12 is a sectional view illustrating an organic light-emitting display device according to a second embodiment of the present invention.

FIG. 12 is a sectional view illustrating an organic light-emitting display device according to a second embodiment of the present invention.

As shown in FIG. 12, the organic light-emitting display device according to the second embodiment of the present invention differs from the first embodiment shown in FIG. 3 in that the second auxiliary hole transport layer is positioned in the same layer as the first auxiliary hole transport layer.

In the organic light-emitting display device of the present invention, the layers between the first electrode 110 and the second electrode 170 are formed in the manner of evaporating an organic material in the corresponding layer and depositing the same on the substrate. At this time, when layers that require distinction between sub-pixels are formed, deposition masks are individually required for the respective layers.

In the organic light-emitting display device according to the second embodiment of the present invention shown in FIG. 12, the layers that require deposition masks are the first to third light-emitting layers 151, 152 and 153, the first auxiliary hole transport layer 130 and the second auxiliary hole transport layer 240.

Because the first auxiliary hole transport layer 130 and the second auxiliary hole transport layer 240 respectively function to adjust the optical distance of the first light-emitting layer 151 and the optical distance of the third light-emitting layer 153, the first auxiliary hole transport layer 130 and the second auxiliary hole transport layer 240 have different thicknesses from each other, and may therefore be formed using mutually different deposition masks. Alternatively, when the same mask is used, the first auxiliary hole transport layer 130 may first be formed through an opening formed in the deposition mask, the deposition mask may be shifted to the neighboring sub-pixel, and the second auxiliary hole transport layer 240 may then be formed through the opening in the deposition mask. At this time, the thicknesses of the first auxiliary hole transport layer 130 and the second auxiliary hole transport layer 240 may be set to desired values by adjusting the supply time period of respective materials supplied through the deposition mask.

In this structure, the first auxiliary hole transport layer 130 and the second auxiliary hole transport layer 240 commonly capture carriers moving due to leakage current and block upward movement thereof in the corresponding sub-pixels, thereby preventing unintentional light emission due to leakage current.

As described above, the organic light-emitting display device according to the present invention is characterized in that the auxiliary hole transport layer for adjusting the optical distance is selectively provided in a sub-pixel, which is vulnerable to leakage current, so as to be in contact with the first common layer having the highest hole mobility. Accordingly, the auxiliary hole transport layer captures carriers moving due to leakage current and blocks upward movement thereof in the corresponding sub-pixel, thereby preventing unintentional light emission due to leakage current. That is, the sub-pixel having the auxiliary hole transport layer is prevented from malfunctioning due to leakage current that is generated by the operation of the neighboring sub-pixel.

Further, when the neighboring sub-pixel performs low-gradation driving, the auxiliary hole transport layer may act as resistance that blocks lateral current flow.

Furthermore, since the auxiliary hole transport layer has a cut portion on the bank for defining the emission portion in each of the sub-pixels, it may be separated from the neighboring sub-pixel and may also be electrically isolated therefrom.

That is, the organic light-emitting display device according to the present invention may prevent color mixing between neighboring sub-pixels and consequently may improve the quality of the product.

As is apparent from the above description, an organic light-emitting display device according to the present invention has the following effects.

First, when a common layer, which includes a material having high hole mobility, is provided in contact with an anode in order to increase the hole injection efficiency, an auxiliary hole transport layer is provided only in a sub-pixel that is vulnerable to leakage current so as to be in contact with the common layer, thereby preventing the sub-pixel having the auxiliary hole transport layer from malfunctioning due to leakage current that is generated by the operation of a neighboring sub-pixel.

Secondly, when the neighboring sub-pixel performs low-gradation driving, the auxiliary hole transport layer may act as resistance that blocks lateral current flow.

Finally, since the auxiliary hole transport layer has a cut portion on a bank for defining an emission portion in each of the sub-pixels, it may be separated from the neighboring sub-pixel and may also be electrically isolated therefrom.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. An organic light-emitting display device comprising:
    a substrate having first, second and third sub-pixels;
    a first electrode individually provided in each of the first to third sub-pixels;
    a first common layer provided on the first to third sub-pixels of the substrate in order to cover the first electrodes;
    a first auxiliary hole transport layer provided on the first common layer in the first sub-pixel so as to be in contact with the first common layer;
    a second common layer covering the first auxiliary hole transport layer and the first common layer, the second common layer having a higher highest occupied molecular orbital (HOMO) energy level than the first auxiliary hole transport layer;
    first, second and third light-emitting layers respectively provided at the first to third sub-pixels so as to be disposed on the second common layer;
    a third common layer provided on the first to third light-emitting layers;
    a fourth common layer provided between the second common layer and each of the first to third light-emitting layers; and
    a second electrode provided on the third common layer.

2. The organic light-emitting display device according to claim 1, wherein the fourth common layer has a lower HOMO energy level than the first auxiliary hole transport layer.

3. The organic light-emitting display device according to claim 1, wherein a hole mobility of the first common layer is higher than those of the first auxiliary hole transport layer and the second common layer.

4. The organic light-emitting display device according to claim 1, wherein the second light-emitting layer includes a host having a lower HOMO energy level than those of the first light-emitting layer and the third light-emitting layer.

5. The organic light-emitting display device according to claim 4, wherein the first auxiliary hole transport layer of the first sub-pixel and the second common layer of the second and third sub-pixels are positioned in a same layer as each other in a horizontal direction.

6. The organic light-emitting display device according to claim 5, wherein, when voltage is selectively applied only to the first electrode and the second electrode of the second sub-pixel, the first auxiliary hole transport layer acts as resistance at a boundary between the second sub-pixel and the first sub-pixel.

7. The organic light-emitting display device according to claim 4, further comprising:
    a second auxiliary hole transport layer provided in the third sub-pixel,
    wherein the second auxiliary hole transport layer is positioned between the second common layer and the fourth common layer or between the first common layer and the second common layer.

8. The organic light-emitting display device according to claim 7, wherein the second auxiliary hole transport layer has a smaller thickness than the first auxiliary hole transport layer.

9. The organic light-emitting display device according to claim 7, further comprising:
    a bank provided at a boundary of each of the sub-pixels.

10. The organic light-emitting display device according to claim 9, wherein the first auxiliary hole transport layer has a cut portion on the bank positioned at an adjacent portion of the first sub-pixel.

11. The organic light-emitting display device according to claim 9, wherein the second auxiliary hole transport layer has a cut portion on the bank positioned at an adjacent portion of the third sub-pixel.

12. The organic light-emitting display device according to claim 4, wherein the first light-emitting layer emits colored light having a longest wavelength, the third light-emitting layer emits colored light having an intermediate wavelength, and the second light-emitting layer emits colored light having a shortest wavelength.

* * * * *